United States Patent
Lu et al.

(10) Patent No.: US 6,487,697 B1
(45) Date of Patent: Nov. 26, 2002

(54) DISTRIBUTION DEPENDENT CLUSTERING IN BUFFER INSERTION OF HIGH FANOUT NETS

(75) Inventors: Aiguo Lu, Cupertino, CA (US); Ivan Pavisic, San Jose, CA (US); Andrej A. Zolotykh, Moskovaskaya Oblast (RU)

(73) Assignee: LSI Logic Corporation, Milpitas, CA (US)

( * ) Notice: Subject to any disclaimer, the term of this patent is extended or adjusted under 35 U.S.C. 154(b) by 77 days.

(21) Appl. No.: 09/820,059

(22) Filed: Mar. 28, 2001

(51) Int. Cl.[7] ............................................. G06F 17/50
(52) U.S. Cl. ................................. 716/2; 716/9; 716/6
(58) Field of Search ................................. 716/2, 4, 5, 6, 716/9

(56) References Cited

U.S. PATENT DOCUMENTS

| | | | | |
|---|---|---|---|---|
| 5,202,640 A | * | 4/1993 | Schaaf et al. | 324/158.1 |
| 5,568,395 A | * | 10/1996 | Huang | 703/13 |
| 5,654,931 A | * | 8/1997 | Tamba et al. | 365/191 |
| 5,656,950 A | * | 8/1997 | Duong et al. | 326/39 |
| 6,205,572 B1 | * | 3/2001 | Dupenloup | 716/2 |

FOREIGN PATENT DOCUMENTS

| | | | |
|---|---|---|---|
| JP | 0812957 A | * | 5/1996 |

OTHER PUBLICATIONS

Ashok Jagannathan, Sung–Woo and John Lillis, "A Fast Algorithm for Context–Aware Buffer Insertion," DAC' 2000, pp. 368–373.

Jason Cong and Xin Yuan, "Routing Tree Construction Under Fixed Buffer Locations," DAC'2000, pp. 379–384.

\* cited by examiner

*Primary Examiner*—Tuan T. Lam
*Assistant Examiner*—Cassandra Cox
(74) *Attorney, Agent, or Firm*—Westman, Champlin & Kelly (57) ABSTRACT

Methods and apparatus are disclosed for inserting buffers into the design of an integrated circuit with a high fanout net. If a net has a ramptime violation, all of the driven elements in the net are clustered in such a manner that the total load (capacitance) of the driver decreases. Clustering is based upon a two-dimensional partitioning approach together with three proposed heuristics (expand, shrink and merge), which iteratively partitions the placement regions of the net such that the number of buffers to be inserted and the level of inserted buffer tree are minimized. After clustering, one buffer is inserted for each cluster created in the clustering operation. Each of the inserted buffers drives its corresponding cluster. The buffers that are inserted will not have any ramptime violation, which ensures converge of the buffer insertion scheme. Therefore, each insertion of a level of buffers reduces the overall ramptime of the net. After insertion of a level of buffers, the ramptime of the net is checked once again. If it is still not acceptable, the aforementioned clustering and insertion are repeated and the above cycle is iterated until there is no ramptime violation. During the first iteration of clustering and buffer insertion, the original circuit elements are clustered. After the first iteration of clustering and buffer insertion, the driven elements that are clustered are the buffers that were inserted in the previous iteration. In this manner, levels of buffers may be inserted into the net.

21 Claims, 5 Drawing Sheets

DISTRIBUTION DEPENDENT CLUSTERING IN BUFFER INSERTION OF HIGH FANOUT NETS

BACKGROUND OF THE INVENTION

1. Field of the Invention

The invention relates generally to the computer aided design of integrated circuits. More specifically, the invention relates to methods and apparatus automating the insertion of buffers during the design phase of an integrated circuit.

2. Description of the Related Art

Integrated circuits comprise a large number of circuit elements, mainly transistors, interconnected by a large number of wires. Some of the transistors ("drivers") drive other circuit elements ("driven elements"). The number of drivedriven elements coupled to the output of a driver is known as the fanout of the driver.

The "ramptime" of the driven elements coupled to a driver depends on the amount of capacitance and resistance "seen" by that driver, which in turn depends on the number of driven elements connected to the output of that driver and the length of the wires that interconnect the driver with its driven elements. If a driver's load exceeds a certain threshold, the ramptime for its driven elements will also exceed a corresponding threshold, and the circuit will not function properly. To avoid this problem, during the design phase of an integrated circuit, additional drivers known as buffers are selectively inserted between drivers and driven elements.

Since each added buffer increases power consumption, it is generally desirable to minimize the number of buffers that are added. Also, since each buffer adds its own delay, it is generally desirable to minimize the number of levels of added buffers, where a single level of buffers is a set of buffers that drive other buffers or the design's driven elements. (E.g. a buffer driving a buffer that drives a number of original driven elements corresponds to two levels of buffers.) It is also desirable to insert buffers in such a way as to minimize the overall interconnect length. Currently, buffer insertion is often performed manually; given the large number of possible buffer insertion points and the complexity of the above mentioned design goals, it is desirable to automate the location of buffer insertion points.

One proposed automated method for selecting buffer insertion points involves finding a best "path" through a directed graph. A Fast Algorithm for Context-Aware Buffer Insertion, Jagannathan, Hur and Lillis, Design Automation Conference '2000, pp. 368–373; Routing Tree Construction Under Fixed Buffer Locations, Cong and Yuan, Design Automation Conference '2000, pp. 379–384. More particularly, a directed graph is created with a source (the original driver within a circuit), sinks (driven elements) and nodes in the graph representing possible buffer insertion points between the sources and sinks. Typically, the possible buffer insertion points are chosen randomly, subject to the floorplanning constraints of the integrated circuit (i.e. buffers can only be inserted within certain portions of the circuit). Edges connect "neighboring nodes"; two nodes are considered to be neighbors if the corresponding buffers (would) lie within a threshold distance that is process dependent.

The resulting graph has a large number of possible paths from the source to any sink, where each path represents a possible set of buffer insertions points and corresponding connections therebetween. Various methods are employed (Id.) to find a best path; the nodes in this best path are then the chosen buffer insertion points.

However, it is not clear how effectively the directed graph method would function for high fanout nets (e.g. nets with thousands or tens of thousands of fanouts). In particular, the computation time required to implement directed graph algorithms for high fanout nets may be unacceptably long. Further, it is no clear how well directed graph methods would achieve the previously mentioned design goals for buffer insertion methods.

In sum, there is a need for a method and apparatus that can efficiently locate buffer insertion points for high fanout nets while at least reasonably satisfying buffer insertion design goals.

SUMMARY OF THE INVENTION

To achieve the foregoing, the present invention is a method and apparatus for decreasing the ramptime of a high fanout net in an integrated circuit. The preferred method is applied after the elements comprising the circuit have been laid out but not yet connected together (i.e. the circuit has been "placed" but not yet "routed".)

According to an implementation of the present invention, it is determined whether a net has a ramptime violation. If so, all of the driven elements are clustered in such a manner that the total load (capacitance) of the driver decreases. The preferred clustering method minimizes the number of inserted buffers, the total interconnect length, and the number of levels of the inserted buffer tree. After clustering, one level of buffers is inserted into the net. More particularly, one buffer is inserted for each cluster created in the previously mentioned step; each of the inserted buffers drives its corresponding cluster. The buffers that are inserted will not have any ramptime violation. Therefore, each insertion of a level of buffers reduces the overall ramptime of the net.

After insertion of a level of buffers, the ramptime of the net is checked once again. If it is still not acceptable, the aforementioned clustering and insertion are repeated and the above cycle is iterated until there is no ramptime violation. During the first iteration of clustering and buffer insertion, the original circuit elements are clustered. After the first iteration of clustering and buffer insertion, the driven elements that are clustered are the buffers that were inserted in the previous iteration. In this manner, levels of buffers may be inserted into the net.

The preferred clustering method is based upon the concept of a "bounding box." For any given net, a bounding box is determined according to the location of the net's driver and the distribution of all that driver's driven elements. A bounding box corresponds to a rectangular region within the integrated circuit in which a driver and all of its associated driven elements reside. The outer boundaries of a bounding box are defined based on the maximum x and y coordinates as well as the minimum x and y coordinates of all pins, that are not already directly driven by a buffer, connected to the net being considered (driver and all driven elements). The driven elements furthest away from the driver define the outer boundaries of the bounding box.

A bounding box, and therefore the net that it represents, may be partitioned into a plurality of regions, where once again each region corresponds to a physical region on the integrated circuit. The bounding box that contains the entire net is partitioned into four rectangular regions that all meet at the net's driver while all other bounding boxes, which result from subsequent partitions, are partitioned from their centers into four equal sized rectangular regions. The original bounding box (region) is a "parent" region while the regions resulting from the partition are the "children" of that parent. Each of the children regions may be partitioned, and so on, creating a number of levels of regions.

To perform the preferred clustering method, the bounding box of a net is determined. The bounding box is partitioned, preferably into four equal sized rectangular regions, as previously described. One of the children regions is selected and the number of driven elements therein (ND) is checked against the maximum number of allowable fanouts (MF). MF is dictated by the design rules for any particular process technology. The first time that elements are clustered, the driven elements are the original circuit elements on the integrated circuit. For each subsequent clustering, the driven elements are the buffers that were inserted during the most recent clustering.

If the number of driven elements of the selected child region (ND) is greater than the maximum number of allowable fanouts (MF), the child is partitioned iteratively until a region is found whose ND<MF. Once such a region is located, it is expanded by adding portions of its neighboring regions until the resulting expanded region ("cluster") no longer satisfies both $ND_{cluster}<MF$ and $C_{cluster}<MC$, where $C_{cluster}$ is the capacitance of the cluster and MC is the maximum allowable capacitive load. Once such a cluster has been found, it is shrunk until $C_{cluster}<=MC$. The cluster is "extracted" so that it is no longer subject to further clustering and a buffer is inserted into the net such that it drives the cluster.

Those portions of the cluster's neighboring regions that were not incorporated into the cluster that was extracted are merged with all of the remaining regions at their parent's level. In other words, all of the regions at the parent's level are combined, except for the region that was extracted. This combined region's ND is checked against MF, as previously described above, and the above cycle is iterated until all of the driven elements in the net have been clustered.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF ILLUSTRATIVE EMBODIMENTS

Definitions

A "region" of a net means any portion of the layout of an integrated circuit. A single "region" need not be continuous. Any "region" contains a plurality of "regions," except for those "regions" that consist of an area equal to the area of one single circuit element, which is smallest possible circuit element on an integrated circuit.

A "cluster" is a specified "region" of an integrated circuit.

A buffer that is "inserted into a design" such that it "drives a region" or "drives a cluster" means a buffer is inserted such that it drives all of the circuit elements in a region or cluster that are both part of the net that is being processed and not already directly driven by a buffer that was previously inserted according to the teachings of the present invention. For example, if a region or cluster has three circuit elements incorporated therein, and two of the circuit elements are driven by a buffer (the third circuit element), a new buffer inserted into the design such that it drives the region or cluster means that the new buffer will drive the preexisting buffer, but not the two circuit elements which are driven by the preexisting buffer.

Description

Figure 1:
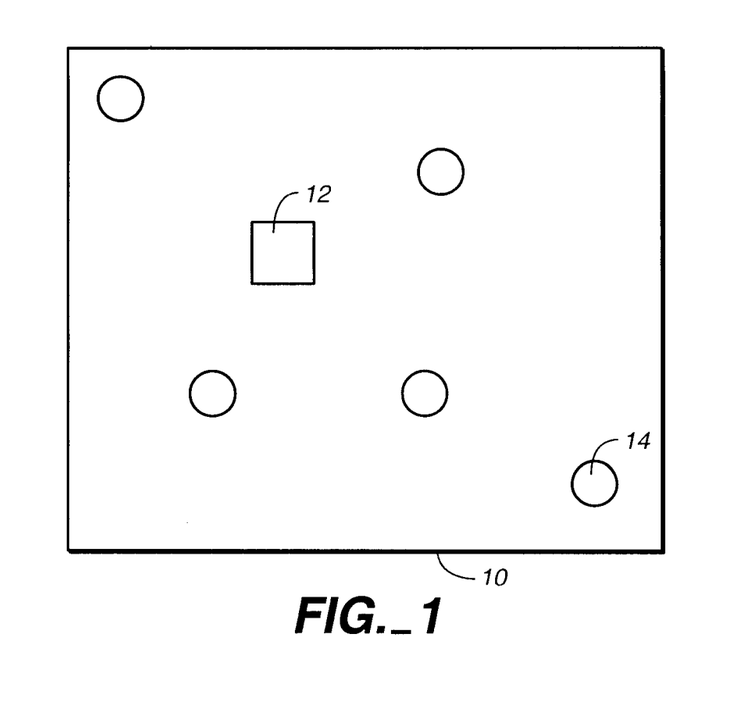
FIG. 1 diagrammatically shows the layout of a fanout net that comprises a portion of an integrated circuit.

FIG. 1 diagrammatically shows the layout of a net 10 that is part of an integrated circuit. As shown, the net 10 comprises a driver 12 which may be any number of circuit elements (e.g. a clock) and a plurality of elements 14 with inputs that will eventually be coupled to the output of the driver 12. The plurality of elements 14 may be any combination of many types of circuit elements (e.g. flip flops). Although the locations of the driver 12 and the plurality of elements 14 have been fixed, they have not yet been interconnected (i.e. the net 10 has been "placed" but not yet "routed".)

Figure 2:
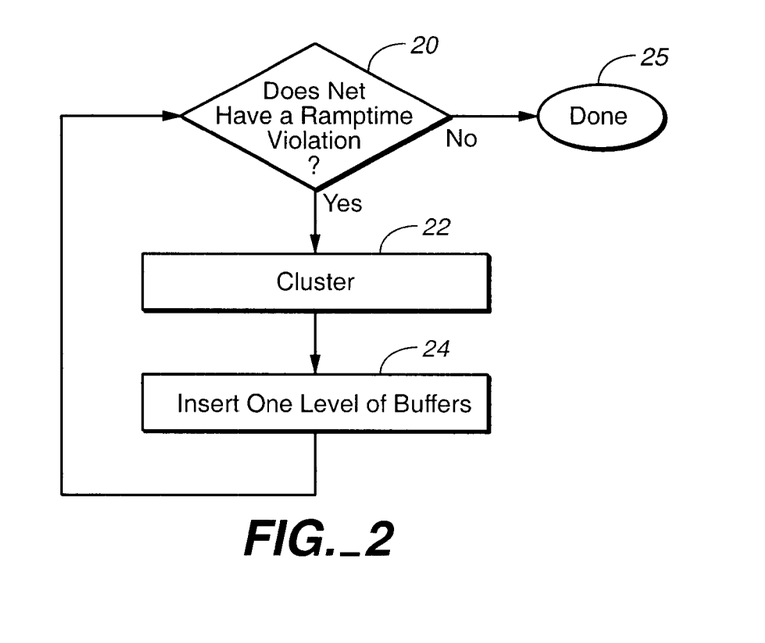
FIG. 2 is a top level flow chart of a possible method for decreasing the ramptime of a high fanout net in an integrated circuit according to the teachings of the present invention.

FIG. 2 is a top level flow chart of a possible method for decreasing the ramptime of a net in an integrated circuit, such as the net 10 in FIG. 1, according to the teachings of the present invention. The preferred method described below is applied to a design, such as that shown in FIG. 1, that dictates the placement of most of the original integrated circuit elements but not the interconnections therebetween. In block 20, it is determined whether the net has a ramptime violation. If so, control passes to block 22, in which driven elements are clustered, preferably according to the method described with reference to FIGS. 2–7, in such a manner that the total load (capacitance) of the driver decreases.

As will be described more fully with reference to FIG. 4, the preferred clustering method involves searching for regions of the net that, when driven by a buffer, would have an acceptable ramptime. Buffers are then inserted into these regions. The preferred clustering method minimizes the number of inserted buffers, the total interconnect length, and the levels of the inserted buffer tree. After clustering, control passes to block 24, one level of buffers is inserted into the net. More particularly, one buffer is inserted for each cluster created in block 22; each of the inserted buffers drives its corresponding cluster. As will become apparent with reference to the clustering method shown in FIG. 4, those buffers that are inserted will not have any ramptime violation. Therefore, each insertion of a level of buffers reduces the overall ramptime of the net.

Control then passes back to block 20, which determines whether the revised net still has a ramptime violation. If so, the aforementioned steps in blocks 22 and 24 are repeated. More particularly, in block 22, after the first iteration of blocks 20, 22 and 24, the driven elements that are clustered are the buffers that were inserted in block 24 in the previous iteration. Thus, each buffer inserted subsequent to the first iteration drives a group comprising one or more buffers inserted during the previous iteration. (During the first iteration, in block 22, the driven elements are the original elements in the net.) Blocks 20, 22 and 24 are iteratively repeated until there is no ramptime violation, as is determined in block 20, and processing terminates in block 25.

Figure 3:
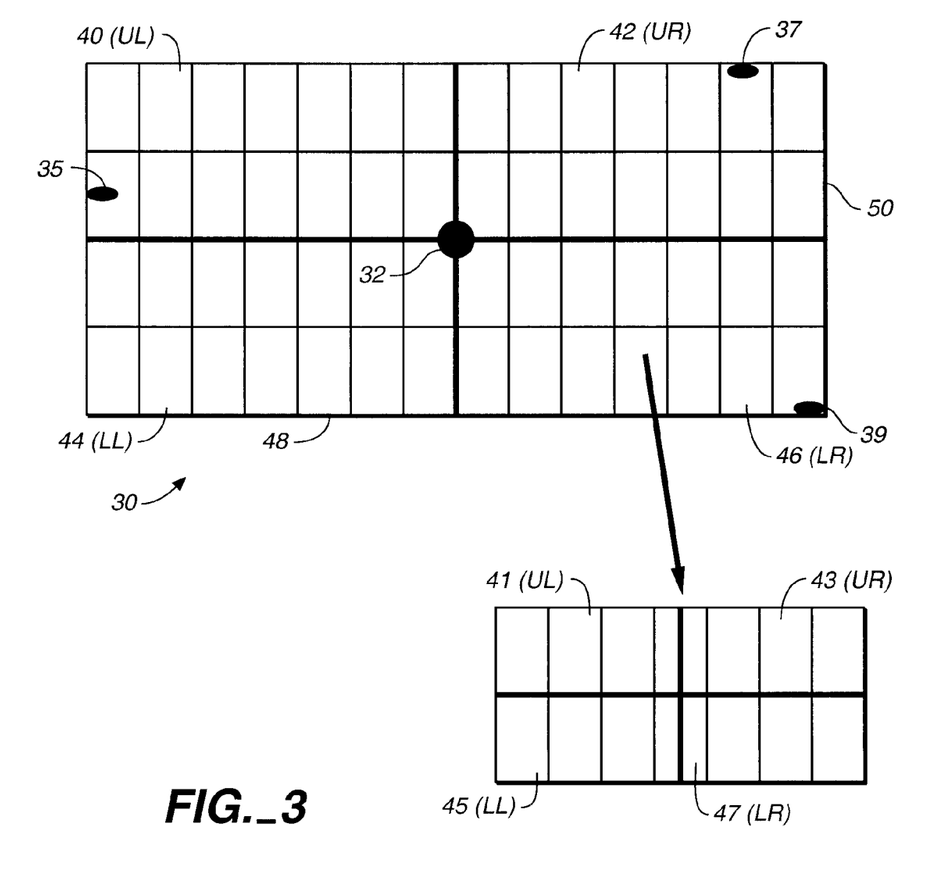
FIG. 3 shows a bounding box that incorporates a driver and all of its driven elements.

The preferred clustering method performed in block 22 will now be described. The preferred clustering method is based upon the concept of a "bounding box." FIG. 3 shows a bounding box. For any given net, such as the net 10 shown in FIG. 1, the bounding box 30 in FIG. 3 is determined according to the location of the net's driver and the distribution of all that driver's driven elements. As shown in FIG. 3, a bounding box 30 corresponds to a rectangular region within the integrated circuit in which a driver 32 and all of its associated driven elements reside. Each driven element has at least one input (a "pin"). Outputs from driven elements are also known as "pins". Those input pins of driven elements furthest away from the driver 32 (i.e. the pins that have minimum and maximum x and y coordinates in a Cartesian coordinate system) define the outer boundaries of the bounding box 30, as is shown by pins 35, 37 and 39 in FIG. 3. The driven elements that define the bounding box are those driven elements which are not already driven by a buffer that was inserted during any previous iteration of blocks 20, 22 and 24 of FIG. 2. Thus, during the first iteration, the defining driven elements are the original circuit elements in the net. After the nth iteration, the driven elements that define the bounding box are the buffers inserted during the n-1th iteration. Hereafter, the length of a bounding box or a region in the x and y directions will be referred to as $l_x$ and $l_y$, respectively.

As will be further described below, a bounding box, and therefore the net that it represents, may be partitioned into a plurality of regions, where once again each region corresponds to a physical region on the integrated circuit. Preferably, a bounding box, such as the bounding box 30 in FIG. 3, is partitioned from the location of the driver 32 into four rectangular regions, which will typically have different dimensions, designated in FIG. 3 as upper left (UL) 40, upper right (UR) 42, lower left (LL) 44 and lower right (LR) 46. The bounding box (region) 30 is a "parent" region while the regions 40, 42, 44 and 46 are the "children" of that parent. The four children 40, 42, 44 and 46 that result from the partitioning of the bounding box 30 that represents an entire net will be referred to as "super regions." Each of these regions 40, 42, 44 and 46 may be further partitioned, preferably into four rectangles with equal dimensions, thereby becoming a "parent," as is shown in FIG. 3 by the partitioning of region 46 into four equally sized rectangular regions 41, 43, 45 and 47, which are the "children" of parent region 46. Each of the regions 41, 43, 45 and 47 may be partitioned, and so on, as will be further described below in connection with FIG. 4.

The bounding box 30 that represents the entire net may be considered to be a first level, which each subsequent partitioning results in the addition of a level. For example, continuing to refer to FIG. 3, the regions 41, 43, 45 and 47 may be considered to be a second level while any regions that result from the partitioning of one of the regions, 41, 43, 45 and 47, would be designated third level regions. The method described with reference to FIG. 4 utilizes the above mentioned concept of levels to identify particular regions.

The method described with reference to FIG. 4 also utilizes the concept of a region counter to identify a particular region at a particular level. Thus, again referring to FIG. 3, a region counter i may be set to LL, LR, UL, or UR. Thus, any region is uniquely defined by its level and its orientation within that level, as specified by the region counter i. As will be described more fully with reference to FIG. 4, the preferred clustering scheme employs a fractal like iterative partitioning scheme, such that each of the regions that results from a partition has a corresponding region, with the same orientation, at both the next higher and the next lower level. (However, the regions at the bottom most level will not have a corresponding region at a lower level.) For example, with reference to FIG. 3, the LR region 47 at level 2 has a corresponding region, LR region 46 at level 1, with the same orientation (i.e. both regions are LR regions).

Circuit elements in an integrated circuit are typically distributed in a regularly spaced array of rows and columns. Therefore, a bounding box or any region therein may be divided into a plurality of rows 48 and columns 50, that correspond to the circuit element layout, such that each intersection of a row with a column defines an area in which a circuit element may reside. For example, in FIG. 3, the bounding box 30 is divided into a plurality of rows and a plurality of columns.

Figure 4:
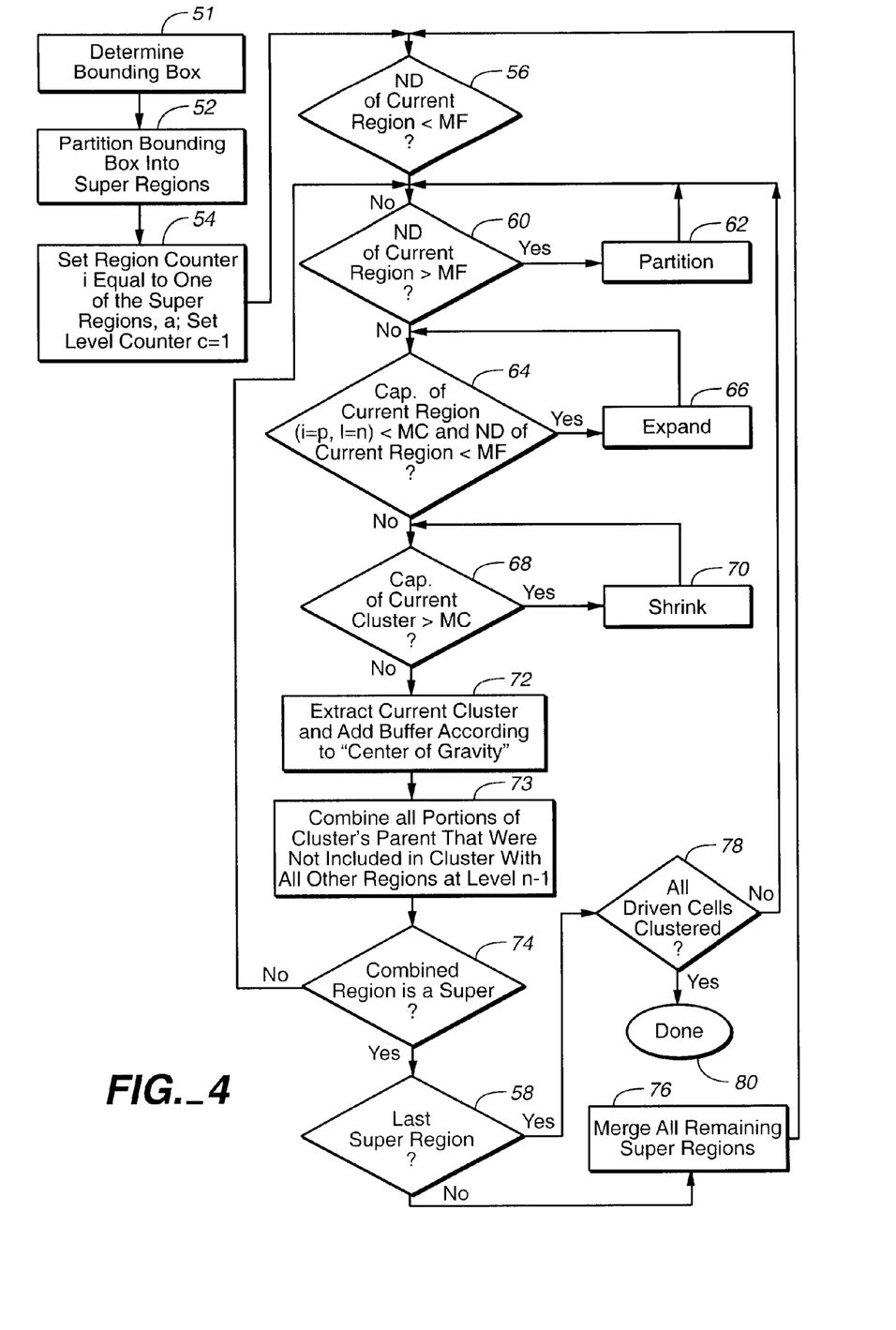
FIG. 4 is a flow chart of a possible implementation of a clustering method performed as one of the steps in the flow chart shown in FIG. 2.

FIG. 4 is a flow chart of a possible implementation of a clustering method performed in block 22 of FIG. 2. In block 51, the bounding box of a net is determined. The net's driver, such as driver 32 in FIG. 3, will be referred to as the "original driver." Control passes to block 52, according to which the bounding box is partitioned, preferably into four rectangular regions that all meet at the location of the original driver. These regions are "super regions," as was previously described with reference to FIG. 3. Control passes to block 54, which sets the current region as one of the four super regions, assumed to be region "a" for the purposes of example, where a is one of {LL, LR, UL, UR}; a corresponding counter i (i={LL, LR, UL, UR}) is set accordingly. The particular super region chosen as the current region may be arbitrarily chosen. Also, a level counter l is set equal to 1. Hereafter, region (i=a,l=b) refers to region a at level b. For convenience, the level l may be dropped from the designation in which case a reference to region i means the ith region at whatever level is indicated by the level counter.

Control passes to block 56, which determines whether the number of driven elements of the current region (region i=a, l=1) (ND) is less than the maximum number of allowable fanouts (MF). MF is dictated by the design rules for any particular process technology. The first time that elements are clustered according to block 22 of FIG. 2, the driven elements are the original circuit elements on the integrated circuit. For each subsequent clustering invoked by block 22 of FIG. 2, the driven elements are the buffers that were inserted during the most recent clustering (i.e. the buffers inserted according to block 22 during the previous iteration of the loop defined by blocks 20–24 of FIG. 2).

Referring once again to block 56 of FIG. 4, if ND<MF, control passes to block 58, which will be further described below. Otherwise, control passes to block 60, which checks whether ND for region (i=a,l=b) exceeds MF. If so, control passes to block 62, according to which region (i=a,l=b) is further partitioned, preferably into four equal sized rectangular regions. The level counter l is also incremented while the counter i is not changed (e.g. if the current region is LR, then the next region to be checked will be LR at the next level). The partitioning process (blocks 60 and 62) continues until a region i=a at a level l=n is located that has less than MF fanouts.

Once such a region has been located, control passes to block 64, which determines whether the capacitive load in the current region (C) is less than the maximum allowable capacitive load (MC). MC is dictated by the maximum driver capability of all of the buffers available in any particular technology library. The capacitive load of a region is directly related to the length $l_x+l_y$ of that region. Block 64 also determines whether ND<MF. If both C<MC and ND<MF (hereafter, C<MC and ND<MF will be referred to as the "loading constraints"), the current region can be expanded. Block 66, to which control is passed if both loading constraints are satisfied, expands the current region. More particularly, at least some of the elements from at least one of the three regions other than region i=a at level l=n will be added to region a so as to minimize the bounding box increase of the region a and to maximize the bounding box decrease of the parent region (i=a,l=n−1) after the current region (i=a,l=n) is extracted from the parent (extraction will be further described below). The expanded region a, into which a buffer will eventually be inserted, will hereafter be referred to as a "cluster." The preferred expansion method, and blocks 64 and 66, will be further described with reference to FIG. 5.

Returning to block 64, if either of the loading constraints are not met, control passes to block 68, which checks whether C>MC. If so, the current cluster is too large. Block 70, to which control is passed if C>MC, shrinks the current cluster, preferably by decreasing it by z in the y direction and by z*RA in the x direction, where $RA=l_x/l_y$ for the parent of the current region (i=a,l=n) that is being expanded and where z is an integer that is incremented by 1 each time block 70 is activated for a particular cluster. Blocks 68 and 70 are iterated until C<=MC, in which case control is passed to block 72.

Figure 7:
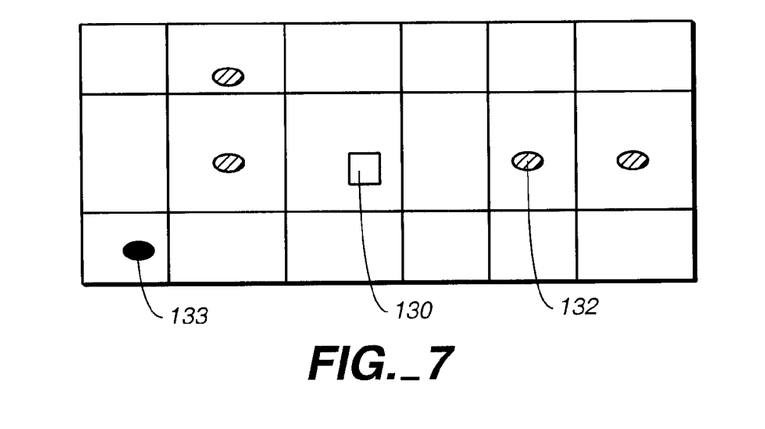
FIG. 7 shows an example of buffer insertion, performed as one of the steps in the flow chart shown in FIG. 2, according to a "center of gravity" principle.

In block 72, the current cluster is extracted from its parent region and a buffer is inserted into the design. The buffer is inserted such that it drives the extracted cluster, in a position that is equal to the "center of gravity" of all of the elements in the cluster and the original driver. More particularly, the x position of the inserted buffer is equal to 1/(N+1) multiplied by the sum of ($x_i$), where $x_i$ is the x position of element I, which can be one of the elements in the cluster or the driver, and N is the number of elements in the cluster. The y position is similarly determined. FIG. 7 shows an example of buffer insertion. As shown in the FIG., a buffer 130 is inserted into the "center of gravity" of a plurality of elements 132 (indicated by diagonal lines) and an original driver 133. According to the above buffer insertion scheme, it is possible that a buffer that drives a cluster will be inserted in a location outside of that cluster.

Figure 5:
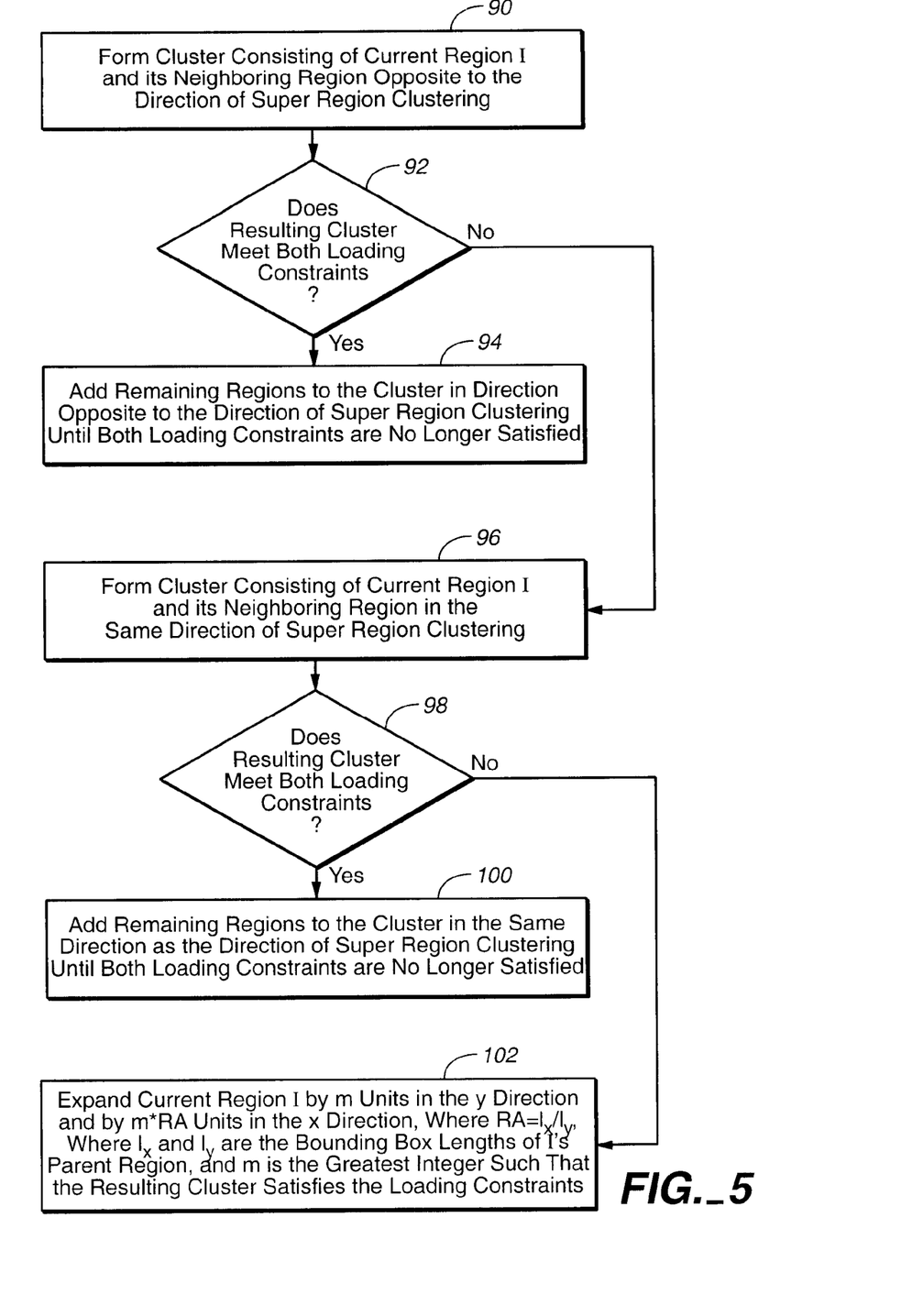
FIG. 5 is a flow chart of a possible implementation of a method for a cluster expansion method performed as one of the steps in the flow chart shown in FIG. 4.
Figure 6A:
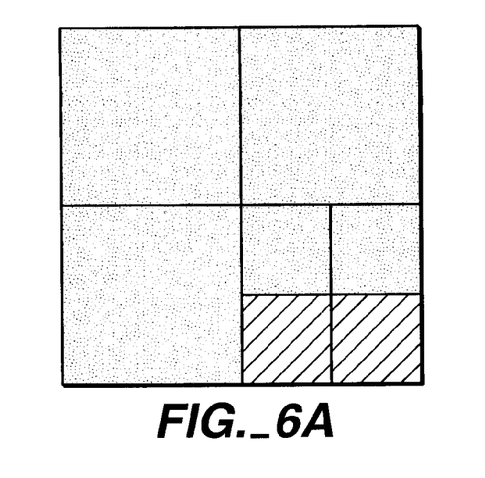
FIGS. 6a and 6b, respectively, show examples of bounding boxes that may result from performing the clustering methods described in FIGS. 4 and 5.
Figure 6B:
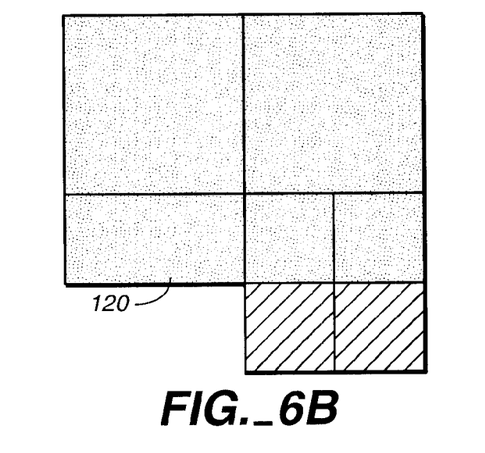

Control passes to block 73, according to which all of the remaining portions of that parent that were not incorporated into the extracted cluster are combined with all of the other regions (i not equal to a) at the parent's level (n−1). FIG. 6a illustrates an example of the above mentioned combination scheme. As shown in the FIG., the LR and LL regions are extracted as a cluster (region with diagonal lines in FIG. 6a) in block 72 and the current working region is the LR region. The UR and UL regions at level n are combined with the UR, UL and LL regions at level n−1 (dotted region in FIG. 6a). The bounding box that is drawn around the combined region is the smallest rectangular box into which the combined region will fit. In the example shown in FIG. 6a, the bounding box drawn around the combined region (diagonal lines) is identical to the original bounding box for the LR region at level n−1 if the pins in the lower left region are located on the lower boundary of the bounding box. FIG. 6b shows a different example, which is identical to the previous example except that region LL at level n−1 has previously been extracted. The bounding box around the combined region is indicated by the dotted region. A rectangular region 120, which was added solely to create a rectangular bounding box, has no elements therein. As is evident from FIG. 6b, as steps 60–74 of FIG. 5 are iterated, bounding box sizes at any particular level (level n−1 in this example) decrease in size and may have different geometrical characteristics (i.e. $l_x/l_y$ may change).

Referring once again to FIG. 4, after extraction and merging in blocks 72 and 73, control passes to block 74, which determines whether the combined region that was created in block 73 is a super region. If not, control is passed back to block 60 and the steps performed in blocks 60–74 are performed once again.

If the combined region is a super region, control passes to block 58, which determines whether there are any remaining super regions. If so, control passes to block 76, according to which the current super region is merged with another super region. According to one embodiment, the current super region is merged with its counter clockwise neighbor super region, if that region has at least one element within it. From block 76, control passes to block 56.

Returning to block 58, if all other super regions have been processed as described above, control passes to block 78, which determines whether there are any driven elements in the current super region that have not yet been clustered. If so, control passes to back to block 60. Otherwise, the net has been fully processed and control passes to block 80, which indicates that the clustering process is complete.

FIG. 5 is a flow chart of a possible implementation of the expansion blocks 64 and 66 of FIG. 4. For purposes of illustration, blocks 64 and 66 were shown two distinct blocks in FIG. 4. However, these blocks are actually interrelated in a more complex fashion, as will now be described. In particular, in block 90 of FIG. 5, a first potential cluster is formed which consists of the current region i and the region that is the neighbor of the current region in the direction (clockwise or counter clockwise) opposite to the direction of the clustering of super regions, which was previously described with reference to block 76 of FIG. 4. For example, if super regions are clustered in the order LL→LR→UR→UL, and the current region i is LR at a level n, then region LL at level n is added to the cluster.

Control passes to block 92 which checks whether the resulting cluster meets the loading constraints. (Block 92 corresponds to block 64 of FIG. 4). If so, then control passes to block 94, which adds the remaining regions, in the previously described direction, to the cluster unless and until a region is added which results in the failure to satisfy one or both of the loading constraints. Returning to the above example, UR is added, and if the resulting cluster meets the loading constraints, UL is added and the resulting cluster checked to determine whether it meets the loading constraints. (Because it checks whether the loading constraints are satisfied, a portion of the procedure performed according to block 94 corresponds to block 64 of FIG. 4). The routine exits and control passes back to block 68 of FIG. 4.

Returning to Block 92 of FIG. 5, if the cluster checked therein did not meet both of the loading constraints, control passes to block 96, according to which a second potential cluster is formed which consists of the current region i and the region that is the neighbor of the current region in the same direction (clockwise or counter clockwise) as the direction of the clustering of super regions, which was previously described with reference to block 76 of FIG. 4. For example, if super regions are clustered in the order LL→LR→UR→UL, and the current region i is LR at a level n, then region UR at level n is added to the cluster.

Control passes to block 98, which checks whether the resulting cluster meets the loading constraints. (Block 98, as well as block 92, corresponds to block 64 of FIG. 4). If so, then control passes to block 100 which adds the remaining regions, in the previously direction described in block 98, to the cluster unless and until a region is added which results in the failure to satisfy one or both of the loading constraints. Returning to the above example, LL is added, and if the resulting cluster meets the loading constraints, UL is added and the resulting cluster checked to determine whether it meets the loading constraints. (Because it checks whether the loading constraints are satisfied, a portion of the procedure performed according to block 100 corresponds to block 64 of FIG. 4). The routine exits and control passes back to block 68 of FIG. 4.

Returning to block 98 of FIG. 5, if either of the loading constraints are not met, then control passes to block 102, which creates a third potential cluster by expanding the current region by m in the y direction and by m*RA in the x direction, where RA is equal to $L_x/L_y$, where $L_x$ and $L_y$ are the bounding box lengths of the current region's parent, and m is the greatest integer such that the resulting cluster satisfies the constraints. (Because it checks whether the loading constraints are satisfied, a portion of the procedure performed according to block 102 corresponds to block 64 of FIG. 4). The routine exits and control passes back to block 68 of FIG. 4.

Although the foregoing invention has been described in detail to facilitate an understanding thereof, it will be apparent that certain changes and modifications may be practiced within the scope of the appended claims.

What is claimed is:

1. A method for designing an integrated circuit, the method operating on a partial design of an integrated circuit wherein the locations of a plurality of the elements comprising the integrated circuit have been arranged, the integrated circuit comprising a net having an original driver the method comprising the steps of:
    (a) determining whether the net has an acceptable ramptime;
    (b) if the net does not have an acceptable ramptime, inserting a buffer into the design such that the buffer inserted according to this step (b) drives a region of the net that, when driven by the buffer inserted according to this step (b), would have an acceptable ramptime;
    (c) if a buffer has been inserted into the design according to step (b), repeating step (a) with the net updated to include the buffer inserted according to step (b);
    (d) If the result of step (c) indicates that the net's ramptime is not acceptable, inserting at least one buffer into the design that drives, at least in part, the buffer inserted according to step (b).

2. The method of claim 1 wherein steps (b) through (d) are iterated until the net's ramptime is acceptable.

3. The method of claim 2 wherein step (b) includes the step of (b)(I) searching for the region of the net that, when driven by the buffer, would have an acceptable ramptime.

4. The method of claim 2 wherein step (b) comprises the step of inserting a plurality of buffers into the design, wherein each of the plurality of buffers thus inserted drives a corresponding one of a plurality of regions, wherein each of the plurality of regions, when driven by its corresponding buffer, would have an acceptable ramptime.

5. The method of claim 4 wherein step (d) comprises the step of inserting a plurality of buffers into the design, wherein each of the plurality of buffers thus inserted drives each of a corresponding group of the plurality of buffers wherein each group comprises at least one of the plurality of buffers inserted according to step (b).

6. The method of claim 3 wherein step (b)(I) comprises the steps of:
    (b)(I)(1) partitioning a current region (i=a,l=b) of the net into a plurality of regions at level l=b+1, where l specifies the level number of the current region and I identifies a particular region at a particular level; and
    (b)(I)(2) determining whether a particular one of the plurality of regions (i=c,l=b+1) meets a specified constraint; and
    (b)(I)(3) if the particular one of the plurality of regions (i=a,l=b+1) does not meet the specified constraint, repeating step (b)(I)(1), where the current region is set to a region other than the particular one of the plurality of regions l is initially set to 1; and the current region of the net in step (b)(I)(1) is initially the entire net.

7. The method of claim 6 wherein step (b)(I)(2) comprises the step of determining whether the number of driven elements in the certain one of the regions at level b+1 exceeds a specified number (MF).

8. The method of claim 7 wherein step (b)(I) further comprises the step of (b)(I)(4) iteratively repeating steps (b)(I)(1), (b)(I)(2) and (b)(I)(3) until a region i=a at a level l=n is found that meets the specified constraint, wherein l is incremented by 1 during each iteration, and wherein, for each iteration, c is set equal to a such that the current region (i=a, l=b) in step (b)(I)(1) is the particular one of the plurality of regions (i=a, l=b−1) in step (b)(I)(2) during the previous iteration.

9. The method of claim 8 wherein the number of regions resulting from a partition according to step (b)(I)(1) remains constant throughout the iterations.

10. The method of claim 9 wherein each region that results from a partition has a corresponding region, with the same orientation, at the next higher level.

11. The method of claim 8 wherein the plurality of regions at any level l that is not equal to 1 are equally sized, and wherein the plurality of regions at level l=1 are four rectangular regions that meet at the original driver.

12. The method of claim 11 wherein each of the plurality of regions at any level l is a rectangle.

13. The method of claim 8 wherein:
    Step (b)(I) further comprises the step of (b)(I)(5) creating a final cluster including the region a at level n and at least a portion of at least one of the other regions at level n, wherein the final cluster, when driven by a buffer, would have an acceptable ramptime; and
    Step (b) comprises the step of inserting a buffer into the design such that the buffer drives the final cluster.

14. The method of claim 13 wherein step (b)(I) further comprises the steps of:
    (b)(I)(6) if n−1 is not equal to 1, (i) merging all of the regions other than region a at level n−1, with all of those portions of regions at level n that were not incorporated into the cluster, thereby creating a new region at level n−1, or (ii) if n−1 is equal to 1, merging a region that is the neighbor of p, in a first direction, at level 1 with all of those portions of regions at level n that were not incorporated into the cluster, thereby creating a new region at level 1;

(b)(I)(7) repeating step (b)(I)(1) with the current region set equal to the new region at level n−1; and (b)(I)(8) iteratively repeating steps (b)(I)(2) through (b)(I)(7) until all of the elements in the net have been clustered.

15. The method of claim 14 wherein step (d) is identical to step (b).

16. The method of claim 15 wherein steps (b) through (d) are iterated until the net's ramptime is acceptable.

17. The method of claim 14 wherein:

the number of regions resulting from a partition according to step (b)(I)(1) remains constant throughout the iterations;

each region that results from a partition has a corresponding region, with the same orientation, at the next higher level;

the plurality of regions at any level l are equally sized;

each of the plurality of regions at any level l is a rectangle defined by its respective lengths in an x direction and a y direction;

the first direction is either clockwise or counterclockwise;

step (b)(I)(2) is performed such that i is set to region a throughout the iterations, such that the particular one of the plurality of regions (i=a,l=L+1) at any level L+1 has an orientation indicated by p;

step (b)(I)(5) comprises the steps of:

(i) determining whether a first potential cluster consisting of region (i=a,l=n) and its neighboring region in a second direction opposite the first direction satisfies a first constraint, (ii) if the first potential cluster satisfies the first constraint, adding to the first potential cluster successive regions in the second direction until the resulting first potential cluster no longer satisfies the first constraint, thereby creating a first preliminary cluster;

(iii) if the first potential cluster does not satisfy the first constraint, determining whether a second potential cluster consisting of region (i=a,l=n) and its neighboring region in the first direction satisfies the first constraint;

(iv) if the first potential cluster does not satisfy the first constraint and if the second potential cluster satisfies the first constraint, adding to the second potential cluster successive regions in the first direction until the resulting second cluster no longer satisfies the first constraint, thereby creating a second preliminary cluster;

(v) if neither the first potential cluster nor the second potential cluster satisfies the first constraint, creating a third potential cluster consisting of the region (i=a,l=n) expanded by m units in the y direction and by m*RA units in the x direction, where RA is equal to $l_x/l_y$, where $l_x$ and $l_y$ are the bounding box lengths of the region (i=a,l=n−1), and m is the greatest integer such that the resulting third potential cluster satisfies the first constraint, thereby creating a third preliminary cluster.

18. The method of claim 17 wherein the first constraint is the satisfaction of both: (i) the number of driven elements in a cluster being less than a specified number of elements; and (ii) the capacitance of a cluster being less than a specified capacitance.

19. The method of claim 18 wherein step (b)(I)(5) further comprises the step of shrinking the whichever of the first, second or third preliminary clusters was created according to step(b) (I)(5) until its capacitance is less than the specified capacitance, thereby creating the final cluster.

20. A method for designing an integrated circuit, the method operating on a partial design of an integrated circuit wherein the locations of a plurality of the elements comprising the integrated circuit have been arranged, the integrated circuit comprising a net, the method comprising the steps of:

(a) locating a first region of the net that, when driven by the buffer, would have an acceptable ramptime;

(b) inserting a buffer into the design such that the buffer drives the first region;

(c) locating a second region of the net that, when driven by the buffer, would have an acceptable ramptime; and (d) inserting a buffer into the design such that the buffer drives the second region.

21. A method for designing an integrated circuit, the method operating on a partial design of an integrated circuit wherein the locations of a plurality of the elements comprising the integrated circuit have been arranged, the integrated circuit comprising a net, the method comprising the steps of:

(a) locating a first region of the net that, when driven by a buffer, would have an acceptable ramptime;

(b) creating a cluster including the region located according to step (a) and a second region such that the cluster, when driven by a buffer, would have an acceptable ramptime; and (c) inserting a buffer into the design such that the buffer drives the second region.

* * * * *